United States Patent
Doczy et al.

(10) Patent No.: US 10,381,556 B2
(45) Date of Patent: Aug. 13, 2019

(54) SPIN TRANSFER TORQUE MEMORY (STTM), METHODS OF FORMING THE SAME USING A NON-CONFORMAL INSULATOR, AND DEVICES INCLUDING THE SAME

(71) Applicant: INTEL CORPORATION, Santa Clara, CA (US)

(72) Inventors: Mark L. Doczy, Beaverton, OR (US); Brian S. Doyle, Portland, OR (US); Charles C. Kuo, Hillsboro, OR (US); Kaan Oguz, Portland, OR (US); Kevin P. O'Brien, Portland, OR (US); Satyarth Suri, Portland, OR (US); Tejaswi K. Indukuri, Boise, ID (US)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 15/753,478

(22) PCT Filed: Sep. 18, 2015

(86) PCT No.: PCT/US2015/050842
§ 371 (c)(1),
(2) Date: Feb. 19, 2018

(87) PCT Pub. No.: WO2017/048271
PCT Pub. Date: Mar. 23, 2017

(65) Prior Publication Data
US 2018/0240969 A1    Aug. 23, 2018

(51) Int. Cl.
*H01L 43/12* (2006.01)
*H01L 43/08* (2006.01)
(Continued)

(52) U.S. Cl.
CPC ............ *H01L 43/12* (2013.01); *H01L 27/222* (2013.01); *H01L 43/08* (2013.01); *H01L 43/10* (2013.01)

(58) Field of Classification Search
CPC ....... H01L 27/222; H01L 43/08; H01L 43/10; H01L 43/12
See application file for complete search history.

(56) References Cited

U.S. PATENT DOCUMENTS 8,975,089 B1 * 3/2015 Jung .................. H01L 43/12
                                          257/295
9,397,287 B1 * 7/2016 Annunziata ......... H01L 43/08
(Continued)

FOREIGN PATENT DOCUMENTS

JP    2013-243220 A    12/2013
WO    2017-048271 A1    3/2017

OTHER PUBLICATIONS

International Preliminary Report on Patentability and Written Opinion issued in PCT Application No. PCT/US2015/050842, dated Mar. 29, 2018, 7 pages.
(Continued)

*Primary Examiner* — Allan R Wilson
(74) *Attorney, Agent, or Firm* — Grossman, Tucker, Perreault & Pfleger, PLLC

(57) ABSTRACT

Technologies for manufacturing spin transfer torque memory (STTM) elements are disclosed. In some embodiments, the technologies include methods for interrupting the electrical continuity of a re-deposited layer that may form on one or more sidewalls of an STTM element during its formation. Devices and systems including such STTM elements are also described.

9 Claims, 11 Drawing Sheets

(51) Int. Cl.
*H01L 27/22* (2006.01)
*H01L 43/10* (2006.01)

(56) References Cited

U.S. PATENT DOCUMENTS

| | | | |
|---|---|---|---|
| 9,882,121 B2* | 1/2018 | Kuo | ........................ H01L 43/02 |
| 2004/0041181 A1* | 3/2004 | Morgan | ................ H01L 27/222 |
| | | | 257/295 |
| 2009/0130779 A1 | 5/2009 | Li et al. | |
| 2011/0233697 A1* | 9/2011 | Kajiyama | ............. H01L 27/228 |
| | | | 257/421 |
| 2011/0235217 A1 | 9/2011 | Chen et al. | |
| 2013/0171743 A1 | 7/2013 | Lee et al. | |
| 2013/0267042 A1 | 10/2013 | Satoh et al. | |
| 2014/0227804 A1 | 8/2014 | Hsu et al. | |
| 2014/0308760 A1 | 10/2014 | Doyle et al. | |
| 2016/0197270 A1* | 7/2016 | Beach | ..................... H01L 43/12 |
| | | | 438/3 |
| 2016/0359101 A1* | 12/2016 | Kuo | ........................ H01L 43/02 |

OTHER PUBLICATIONS

International Search Report and Written Opinion issued in PCT Application No. PCT/US2015/050842, dated Jun. 10, 2016, 9 pages.
Supplementary European Search Report issued in European Application No. 15904263.9, dated Apr. 8, 2019, 7 pages.

\* cited by examiner

400

SPIN TRANSFER TORQUE MEMORY (STTM), METHODS OF FORMING THE SAME USING A NON-CONFORMAL INSULATOR, AND DEVICES INCLUDING THE SAME

CROSS-REFERENCE TO RELATED APPLICATIONS

This present application is a National Phase Application Filed Under 35 U.S.C. 371 claiming priority to PCT/US2015/050842 filed Sep. 18, 2015, the entire disclosure of which is incorporated herein by reference.

FIELD

The present disclosure generally relates to memory devices and, in particular, to spin transfer torque memory (STTM) devices. Methods of forming STTM elements and devices including STTM are also described.

BACKGROUND

For the past several decades, feature scaling has been a driving force in the production of integrated circuits in the semiconductor industry. Scaling features to smaller and smaller size can enable the production of devices that include a larger number of functional units within the limited real estate of a semiconductor chip. For example, shrinking transistor size may allow for an increased number of memory devices to be placed within a given area of a semiconductor chip, leading to the production of memory devices with increased storage capacity. However, shrinking feature size can also lead to challenges during manufacturing that in some instances can be difficult to address.

With the foregoing in mind, spin transfer torque memory (STTM) is a type of memory device that is becoming of increasing interest in the semiconductor industry, due to the relatively small size of its elements, its potential for low power operation, and its potential for direct integration directly with other elements on a semiconductor chip, such as transistors.

Generally, the operation of STTM devices is predicated on the phenomenon of spin transfer torque. When a current is passed through a magnetization layer of such devices, called the fixed magnetic layer, the current will come out spin polarized. With the passing of each electron in the current through the fixed magnetic layer, the resulting spin (angular momentum) may be transferred to the magnetization of another magnetic layer in the device, called the free magnetic layer, resulting in a small change in the magnetization of the free magnetic layer. In effect, this is a torque which causes precession of the magnetization of the free magnetic layer. Likewise, a torque may be applied to an associated fixed magnetic layer, e.g., due to the reflection of electrons.

Ultimately, when an applied current (e.g., a pulse) exceeds a threshold value (which may be defined at least in part by damping caused by the magnetic material and its environment) the orientation of the magnetization of the free magnetic layer may be switched between a state that is parallel with the orientation of the magnetization of the fixed magnetic layer, and a state that is antiparallel with the orientation of the magnetization of the fixed magnetic layer. The orientation of the magnetization of the fixed magnetic layer may remain unchanged by the applied current, e.g., because the applied current is below a threshold for the fixed magnetic layer and/or because the orientation of the magnetization of the fixed magnetic layer may be "pinned" by one or more adjacent layers, such as a synthetic antiferromagnetic layer. As such, spin transfer torque can be used to flip the active elements in a random access memory, such as an STTM device.

Although previously developed STTM devices have proven useful, challenges have arisen as such devices have been scaled to smaller and smaller dimensions.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

DETAILED DESCRIPTION

Figure 1:
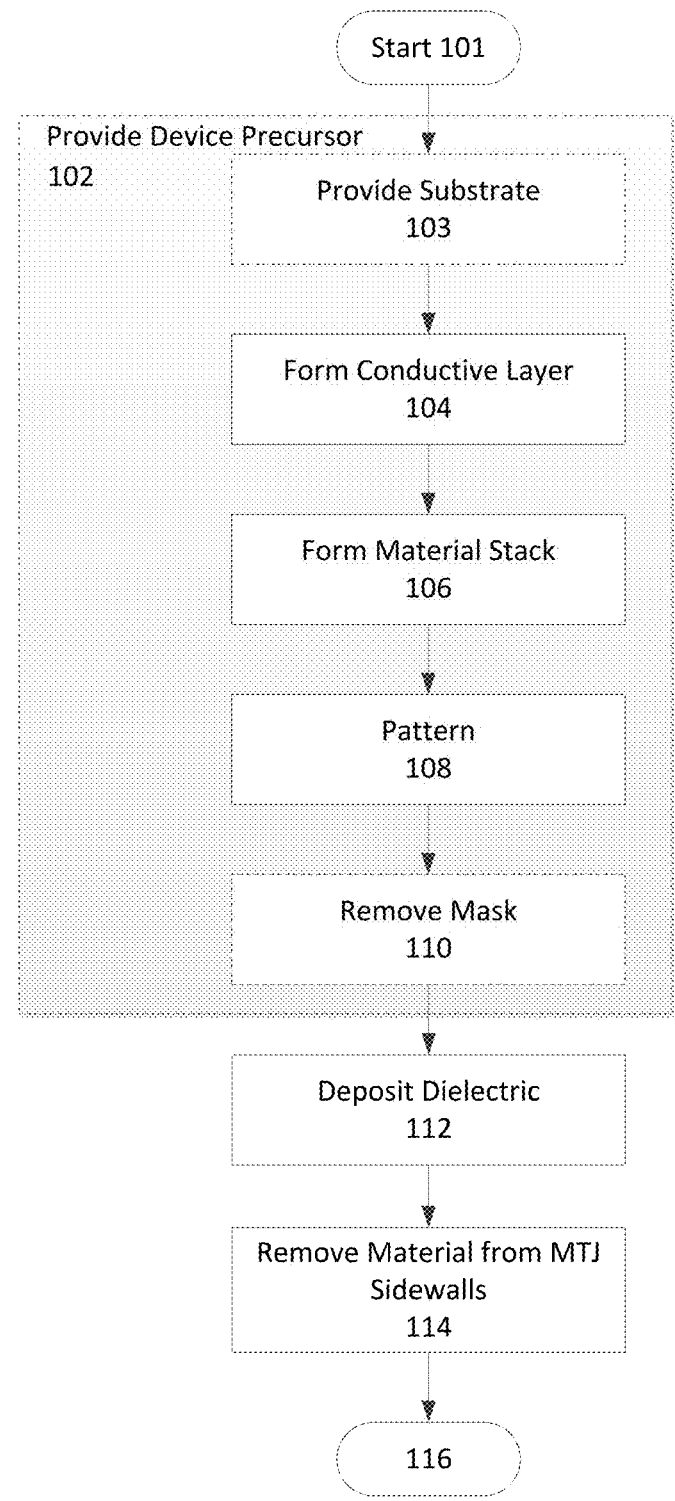
FIG. 1 is a flow chart of operations of one example of a method of forming a spin transfer torque memory (STTM) element consistent with embodiments of the present disclosure.

Spin transfer torque memory (STTM) elements and methods of forming such elements are described herein. Devices and systems including STTM elements consistent with the present disclosure are also described. It is noted that for the sake of clarity and ease of understanding the following Detailed Description will proceed with reference being made to illustrative embodiments as shown in the accompanying figures (FIGS), in order to provide a thorough understanding thereof. It will be apparent to one of ordinary skill in the art however that the technologies described herein are not limited to the illustrated embodiments, and may be practiced in other contexts and/or without certain specific details including in the illustrated embodiments. It should also be appreciated that the various embodiments shown in the FIGS. are illustrative embodiments and are not drawn to scale.

One aspect of the present disclosure relates to methods for forming spin transfer torque memory (STTM) elements. As will be appreciated, such methods may be useful in forming STTM elements in the context of a wide variety of devices. For example, the technologies described herein may be useful for forming STTM elements in the context of non-volatile memory (NVM), magnetic random access memory (MRAM), magnetic tunnel junction (MTJ) devices including but not limited to perpendicular MTJ devices, STTM devices (e.g., perpendicular STTM devices), non-embedded or stand-alone memory devices, combinations thereof, and the like. Of course such end uses are enumerated for the sake of example only, and it should be understood that the technologies described herein may be used in the context of other devices (or the formation thereof).

As will be appreciated from the following discussion, some embodiments of the present disclosure aim to address certain challenges that may arise during the production of STTM elements. Specifically and as will be further described below, STTM elements may be formed on a dielectric or other substrate via a multistep process. For example, in some instances a process for forming an STTM element may include forming a material stack on conductive element, such as an interconnect, bond pad, trace, etc. that is present on or within a dielectric substrate, such as but not limited to an interlayer dielectric of an interconnect structure. The material stack may include various layers for forming an STTM element. For example, the material stack may include a "fixed" magnetic layer, a dielectric (e.g., tunnel oxide) layer on the fixed magnetic layer, a "free" magnetic layer on the dielectric layer, etc. In some instances one or more transistors may be formed below, in, or on the conductive layer, so as to form a memory cell including a (e.g., one) transistor and an STTM element.

Various other layers may also be included in the material stack, as would be understood by those of ordinary skill in the art. One example of such other layers are pinning layers for the fixed magnetic layer, e.g., one or more synthetic antiferromagnetic layers that may underlie the fixed magnetic layer and may function to pin the magnetization of the fixed magnetic layer in a particular orientation. Further examples of other layers that may be included in the material stack include electrodes (contacts) for the fixed and free magnetic layers. For example, in some embodiments the material stack may include a first contact layer for the fixed magnetic layer, and a second contact layer coupled to the free magnetic layer.

In some processes, regions of the material layer stack may be selectively removed to produce an STTM element with a desired geometry. For example, regions of the material layer stack may be selectively removed to form an STTM element having a "pillar" or "dot-like" structure on the surface of the conductive element (e.g., an interconnect). The result may be the formation of a structure that is similar to the structure shown in FIG. 2H, which is described later. The selective removal of portions of the material layer stack may be accomplished in several ways, such as by the execution of an etching process and/or other material processing steps to remove regions of the material layer stack.

While etching and other processes can successfully remove select portions of the material layer stack, one or more of the layers in the material stack may contain non-volatile components, such as metals. Indeed in many cases, the underlayers, the free magnetic layer, and/or the fixed magnetic layers in the material stack may include metals such as cobalt, iron, platinum, etc. Although such components can be successfully removed from the material stack, e.g., via etching or another process, they may redeposit at another location instead of being completely removed from the workpiece that is being processed. Indeed, the inventors have observed that when a material stack is subject to etching (e.g., plasma etching), at least a portion of the non-volatile components of the material stack (e.g., metals) may be re-deposited as a layer (also referred to herein as a "re-deposited layer") on the sidewalls of the resulting STTM element, e.g., as shown and described later in conjunction with FIG. 2H. This can prove problematic in instances where the re-deposited materials are conductive, as the re-deposited layer may electrically connect the free magnetic layer and the fixed magnetic layer (and/or their associated electrical contacts), potentially resulting in a short. Although the re-deposited material may be removed, e.g., by ion milling or another process, such milling may cause re-deposition of conductive material from the conductive element underlying the STTM element on the sidewalls, which may also cause an electrical short.

Accordingly, one aspect of the present disclosure relates to methods of forming STTM elements. As will be described in detail below, the methods of the present disclosure can effectively address electrical problems that may arise due to the re-deposition of conductive material on one or more sidewalls of an STTM element, e.g., as a result of the etching or other processing of a material stack.

Reference is therefore made to FIG. 1, which is a flow chart of example operations in accordance with a method of forming an STTM element consistent with the present disclosure. For the sake of convenience and ease of understanding, the operations of FIG. 1 will be described in conjunction with FIGS. 2A-2K, which stepwise illustrate the method as it may be used to form one non-limiting example of an STTM element. It should be understood of course that FIGS. 2A-2K are illustrative only and that the geometry, scale, and/or general configuration of the STTM element illustrated thereby are for the sake of example. Indeed and as will be appreciated by one of ordinary skill in the art, the methods described herein may be usefully applied to form a wide variety of STTM elements, and are not limited to the formation of the elements shown in FIGS. 2J-2K.

Figure 2A:
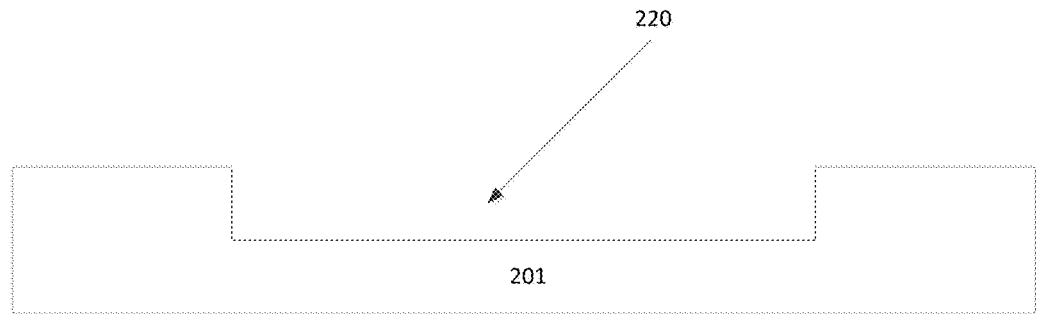
FIGS. 2A-2k stepwise illustrate cross sectional views of various operations in a method of forming a STTM element consistent with embodiments of the present disclosure.
Figure 2B:
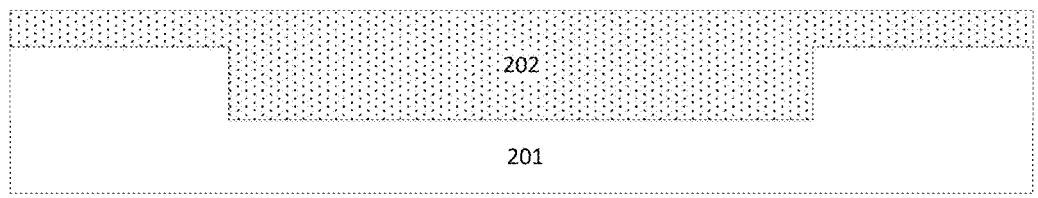

Returning to FIG. 1, method 100 may begin at block 101. The method may proceed to optional block 102, pursuant to which a device precursor may be provided. For the sake of completeness the present disclosure will proceed to describe operations that may be used to prepare a device precursor consistent with the present disclosure, but it should be understood that other methods of providing a precursor are possible. Moreover it should be understood that the specific precursors shown, e.g., in FIGS. 2G and 2H are illustrative only and that the present disclosure is not limited thereto.

With the foregoing in mind, the operations of optional block 102 may begin with optional block 103 pursuant to which a substrate may be provided. The type and nature of the substrate is not limited, provided that it is suitable for the formation and/or support of an STTM element. Non-limiting examples of suitable substrates include but are not limited to dielectric layers such as those that may be found in various components of semiconductor devices (e.g., interconnect layers, bump over metallization layers, etc.) or other components in which dielectric layers may be used. Without limitation, in some embodiments the substrate may be an interlayer dielectric (ILD), e.g., which may be located in or proximate to one or more interconnects of a semiconductor device. Of course, such substrates are enumerated for the sake of example only, and other suitable types of substrates may be used and are envisioned by the present disclosure. In some embodiments, one or more transistors (not shown) may be formed on or within the substrate and coupled to a magnetic tunnel junction (e.g. STTM) device, thereby forming a memory cell including a transistor and an STTM element.

In any case, pursuant to block 103 the substrate may include features which are designed to house or otherwise support conductive pathways (e.g., interconnects) which in turn may be used to couple an STTM element to a voltage or other source. In some embodiments, for example, the substrate may be patterned to include a series of grooves, pits, vias, or other structures that may be used in semiconductor devices to house conductive material used in electrical pathways of a semiconductor device, as understood in the art. As one example of such a substrate reference is made to FIG. 2A, which illustrates a substrate 201 as including a groove 220 which will later support a conductor layer that may serve to connect an STTM element to a voltage or other source. It is noted that for the sake of illustration and ease of understanding, FIGS. 2A-2K provide a "zoomed in" view of the production of a single STTM element, and therefore substrate 201 is shown as including a single groove 220. It should be understood however, that substrate 201 may include a plurality of grooves, pits, vias, or the like, any or all of which may be used to support a conductor layer and an associated STTM element. As will become clear later, in some embodiments groove 220 may be dimensioned such that it has a width that is greater than the width of a STTM element in at least one dimension. Moreover for the sake of clarity, FIGS. 2A-2K are depicted without transistors (e.g., on the substrate) shown, though it should be understood that in some embodiments one or more transistors may be present on the substrate in a 1:1 or greater than 1:1 correspondence with a material stack of the STTM element.

Returning to FIG. 1, once an appropriate substrate is formed (or if such a substrate is provided by some other means), the method may advance from block 103 to block 104. Pursuant to block 104, a conductor layer may be formed on the substrate. In this regard reference is made to FIGS. 2B and 2C, which depict the formation of conductor layer 202. As shown in FIG. 2B, in some embodiments the formation of conductor layer 202 may be initiated by bulk deposition of conductive material on the upper surface of substrate 201, such that conductor layer 202 is initially formed on the upper surfaces of substrate 201 that are within groove 220, and which are outside groove 220. Such bulk deposition may be performed in any suitable manner, such as by physical vapor deposition, chemical vapor deposition, atomic layer deposition, electrodeposition, electroless deposition, or the like.

Subsequently, in some embodiments the bulk deposited layer may be processed to remove conductive material from the upper surfaces of substrate 201 that are outside groove 220. Such removal may be accomplished in any suitable manner, such as by a controlled etching process, a polishing process, or a combination thereof. Without limitation, in some embodiments a chemical mechanical planarization (CMP) or other polishing process is applied to remove conductive material from the surfaces of substrate 201 that are outside groove 220.

Figure 2C:
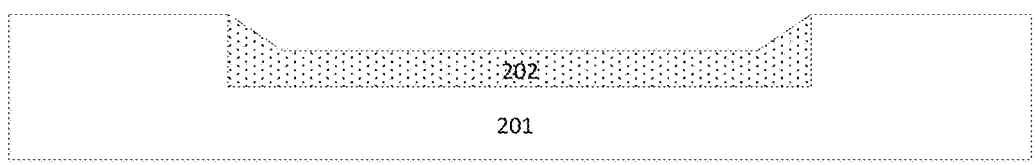

Such processes may result in the production of the structure shown in FIG. 2C, which depicts conductive layer 202 as being isolated within grove 220. As further shown, the CMP or other polishing process may also impart topography to conductive layer 202. In the illustrated embodiment this topography is shown as a slight recession of conductive layer 202 within groove 220, but it should be understood that conductive layer 220 may have any suitable topography. For example, in some embodiments conductive layer 202 may have a substantially flat topography, i.e., one wherein its upper surface is substantially co-planar with the upper surfaces of substrate 201 outside of groove 220.

Of course conductive layer 202 need not be formed by a process in which bulk deposition of conductive material is followed by a CMP or other polishing process, as described above. Indeed, other processes may be used to form conductive layer 202. For example, conductive layer 202 may be formed by a lithographic process. In one example of such a process, a mask may be used to protect the upper surfaces of substrate 201 that are not within groove 220, while leaving groove 220 exposed. Subsequently, conductive material could be deposited within the groove 220 (e.g., by physical vapor deposition, chemical vapor deposition, atomic layer deposition, or the like), followed by removal of the mask. In various embodiments and as shown in FIGS. 2J and 2K, conductive layer 202 may be dimensioned such that it has a width that is larger than the width of a STTM element in at least one dimension.

Regardless of the manner in which it is formed, conductive layer 202 may be formed from one or more electrically conductive materials. Non-limiting examples of such conductive materials include metals such as aluminum, copper, gold, combinations thereof, and the like. Of course, other conductive materials may be used to form conductive layer 202.

Returning to FIG. 1, once a conductive layer has been formed on a substrate the method may advance from block 104 to block 106, pursuant to which a material stack may be formed. As used herein, the term "material stack" is used to refer to a series of material layers which may be subsequently processed to form all or a portion of an STTM device. With that in mind, the present disclosure will proceed to describe the production of one example of a material stack which may be used to form a magnetic tunnel junction (MTJ) of an STTM element.

For the sake of illustration and ease of understanding, the description is limited to the production of an MTJ including a single fixed magnetic layer, a dielectric (e.g., tunnel oxide) layer, and a free magnetic layer, but it should be understood that other layers may also be included. Indeed as noted above, the material stack in some embodiments may include one or more additional layers, such as one or more underlayers beneath the fixed magnetic layer. Such underlayers may include, for example, pinning layers such as synthetic antiferromagnetic layers, electrical contacts such as a first contact layer, etc., combinations thereof, and the like, as would be understood by those of skill in the art. For example in some embodiments (though not shown in the FIGS.), material stack may include a first contact layer on conductive layer 202, one or more underlayers (e.g., antiferromagnetic layers) on the first contact layer, and a fixed magnetic layer on the underlayers. Alternatively or additionally, the material stack may also include one or more over layers, i.e., layers which may be formed over the free magnetic layer of the MTJ. Such over layers may include, for example, a second contact layer as described above, either alone or in combination with other over layers as would be understood by those of skill in the art. Likewise, it should be understood that the fixed magnetic layer, free magnetic layer, and dielectric (e.g. tunnel oxide) layer of the MTJ's described herein may each be formed of one or multiple layers. Moreover the material stack in some embodiments may include one or more layers that include one or more transistors.

Figure 2D:
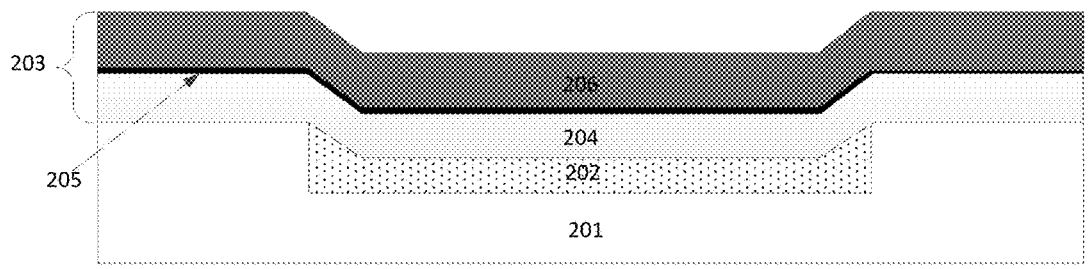

With the foregoing in mind reference is made to FIG. 2D, which illustrates one example of a material stack 203 as formed on the upper surfaces of substrate 201 and conductive layer 202. As shown, material stack 203 includes a fixed magnetic layer 204, dielectric layer 205 (also referred to herein as a first dielectric layer), and free magnetic layer 206.

In the illustrated embodiment, fixed magnetic layer 204 is formed on (e.g., directly on) the upper surfaces of substrate 201, and conductive layer 202, but as noted previously other layers (e.g., a first contact layer, one or more underlayers, etc.) may be present between fixed magnetic layer 204 and the upper surfaces of substrate 201 and conductive layer 202. In any case, fixed magnetic layer may be formed of any suitable materials that may be used in an STTM element, and may include one or more than one layer, as previously described. Non-limiting examples of suitable materials that may be used to form fixed magnetic layer include magnetic alloys of cobalt, such as but not limited to alloys of cobalt, iron, and boron (e.g., CoFeB), one or multiple alternating iron and platinum layers, one or multiple alternating cobalt (Co) and platinum (Pt) layers (Co/Pt), one or multiple alternating cobalt iron alloy (CoFe) and Pt layers (CoFe/Pt), one or multiple alternating iron platinum (FePt) alloy and Pt layers (FePt/Pt), one or multiple layers of a metal X doped with a dopant Y, where x is iron, cobalt, and/or nickel, and Y is boron, phosphorous, carbon, or silicon, one or more iron platinum (FePt) alloy layers, one or multiple alternating layers of CoFeB and a heavy metal, J, wherein J is tungsten, tantalum (Ta), molybdenum (Mo), niobium (Nb), chromium (Cr), or a combination thereof (e.g., (e.g., CoFeB/J/CoFeB) combinations thereof, and the like.

Without limitation, in some embodiments fixed magnetic layer 204 may is formed from one or more layers of CoFeB. In other embodiments, fixed magnetic layer 204 is formed from a stack including a first layer of CoFeB or CoFe, a second layer of ruthenium on the first layer, and a third layer of CoFeB on the ruthenium layer. In on such embodiment, fixed magnetic layer 204 may be an antiferromagnetic stack of CoFe, ruthenium, and CoFeB, wherein the thickness of the second layer (i.e., the ruthenium layer) may be very specific, e.g., ranging from about 4 to about 9 nanometers (nm). Alternatively or additionally, in some embodiments fixed magnetic layer 204 may be formed from one or more alternating layers of CoFeB and a heavy metal, J, wherein J is defined above and each heavy metal layer is about 3 to about 5 angstroms thick.

With the foregoing in mind, in some embodiments fixed magnetic layer 204 may be understood as including the fixed magnetic layers themselves and one or more underlayers that form a synthetic antiferromagnetic structure. In such instances the total thickness of fixed magnetic layer 204 (i.e., both the fixed magnetic layers and the synthetic antiferromagnetic structure) may range from about 50 to about 300 angstroms (about 5 to about 30 nm), such as about 50 to about 200 angstroms (about 5 to about 20 nm).

Regardless of its composition or configuration, fixed magnetic layer 204 may be formed of a material or stack of materials that are suitable for maintaining a fixed majority spin. Thus, fixed magnetic layer 204 in some embodiments may be referred to as a ferromagnetic layer. For example in some embodiments fixed magnetic layer 204 is configured to maintain a fixed majority spin that is substantially aligned with the plane of substrate 201 and/or which is perpendicular or substantially perpendicular to the plane substrate 201. Without limitation, in some embodiments material stack 203 is for forming a perpendicular STTM element, in which case fixed magnetic layer 204 may be configured to maintain a majority spin that is perpendicular to the plane of substrate 201.

The thickness of the one or more layers within fixed magnetic layer 204 may vary considerably depending on the application and the nature of the materials used in material stack 203. For example, in some embodiments the thickness of dielectric layer 204 may range from about 3 angstroms to about 14 angstroms.

The distance (i.e., "height") between the upper surface of conductive layer 202 to the lower surface of dielectric layer 205 may vary considerably and is at least partially defined by the thickness of fixed magnetic layer 204. For example, the height between the upper surface of conductive layer 202 to the lower surface of dielectric layer 205 may range from about 5 nanometers (nm) to about 100 nm, such as from about 5 nm to about 50 nm, or even about 5 nm to about 25 nm. As may be appreciated, the relative thickness of the layer(s) making up fixed magnetic layer 204 may be controlled to obtain a desired magnetic orientation, e.g., to obtain a perpendicular or horizontal magnetic orientation.

Dielectric layer 205 in some embodiments is composed of a material that is suitable for allowing current of a majority spin to pass through it, while impeding at least to some extent the passage of current of a minority spin. Dielectric layer 205 may therefore be understood as a tunneling layer, and may be referred to herein as such. In some embodiments, dielectric layer 205 may be a tunnel oxide layer which is formed from one or more oxides. Non-limiting examples of oxides which may be used to form dielectric layer 205 include magnesium oxide (MgO), aluminum oxide ($Al_2O_3$), europium oxide (EuO), europium magnesium oxide (EuMgO), europium sulfide (EuS), europium selenide (EuSe), bismuth manganate ($BiMnO_3$), nickel iron oxide ($NiFe_2O_4$), cobalt iron oxide ($CoFe_2O_4$), gallium arsenide (GaAs), europium oxide (EuO), strontium titanate ($SrTiO_3$), magnesium aluminum oxide (MgAlO), combinations thereof, and the like. Of course, other suitable materials may also be used to form dielectric layer 205. Without limitation, in some embodiments dielectric layer 205 is formed from MgO.

The thickness of the dielectric layer 205 may vary considerably depending on the application and the nature of the materials used in material stack 203. For example, in some embodiments the thickness of dielectric layer 205 may range from about 6 angstroms to about 12 angstroms. As may be appreciated, the thickness of dielectric layer 205 may impact the resistance area product (RA) of the film, as measured in ohm micron squared ($\Omega\mu^2$). It may therefore be desirable to control the thickness of dielectric layer 205 to achieve a desired RA, such as from about 1 to about 20 $\Omega\mu^2$.

Material stack 203 may be generally configured to provide a planar or a perpendicular STTM element. Depending on the desired configuration, the configuration of fixed magnetic layer 204 and free magnetic layer 206 may be altered. Without limitation, in some embodiments material stack 206 is configured to provide a perpendicular STTM element is formed. In this regard, the free magnetic layer may be configured such that a perpendicular component of the magnetic orientation dominates over an in-plane component of the magnetic orientation of the layer. For example, where free magnetic layer is or includes one or more layers of CoFeB alloy, the perpendicular component of magnetization obtained from the iron of the layer interacting with oxygen in dielectric layer 205 (e.g., MgO) iron may dominate over the horizontal component of magnetization provided in the layer. As may be appreciated, the degree of oxidation of surface (Fe) atoms in free magnetic layer 206 at the interface with the dielectric (MgO) layer 205 may cause free magnetic layer 206 to have perpendicular-dominated spin states.

As noted previously, in some embodiments one or more layers of a CoFeB alloy may be used to form free magnetic layer 206. Although CoFeB may be particularly suitable in some applications, it should be understood that other materials may be used to form free magnetic layer 206. In this regard, free magnetic layer 206 may be formed from one or more layers of magnetic alloys of cobalt, such as but not limited to alloys of cobalt, iron, and boron (e.g., CoFeB), one or multiple alternating iron and platinum layers, one or multiple alternating cobalt (Co) and platinum (Pt) layers (Co/Pt), one or multiple alternating cobalt iron alloy (CoFe) and Pt layers (CoFe/Pt), one or multiple alternating iron platinum (FePt) alloy and Pt layers (FePt/Pt), one or multiple layers of a metal X doped with a dopant Y, where x is iron, cobalt, and/or nickel, and Y is boron, phosphorous, carbon, or silicon, one or more iron platinum (FePt) alloy layers, one or multiple alternating layers of CoFeB and a heavy metal, J, wherein J is defined above, or a combination thereof (e.g., (e.g., CoFeB/H/CoFeB), combinations thereof, and the like.

The thickness of the one or more layers within free magnetic layer 206 may vary considerably depending on the application and the nature of the materials used in material stack 203. For example, in some embodiments the thickness of one or more of the layer(s) in free magnetic layer 206 may range from about 3 angstroms to about 14 Angstroms.

Returning to FIG. 1, once a material stack has been formed pursuant to block 106, the method may advance to block 108, pursuant to which the material stack may be patterned to define the geometry of the STTM device. In this regard it is noted that a wide variety of processing techniques may be employed to pattern material stack 203 into a desired configuration. With that in mind, for the sake of completeness and ease of understanding the present disclosure will proceed to describe a process in which material stack 203 is patterned via a lithographic process.

Figure 2E:
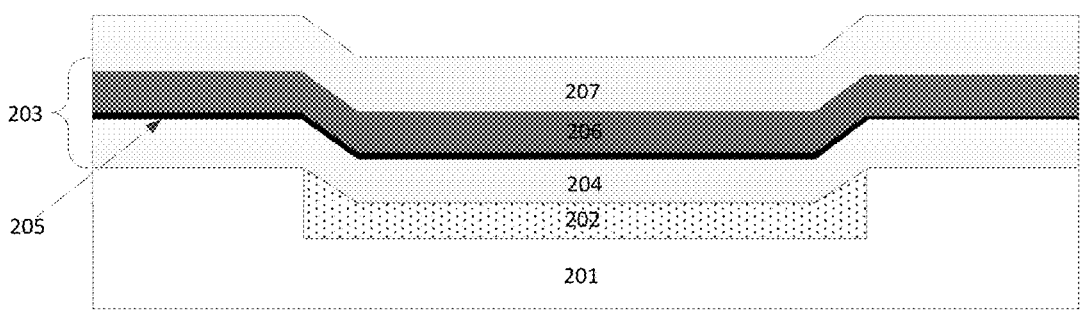
Figure 2F:
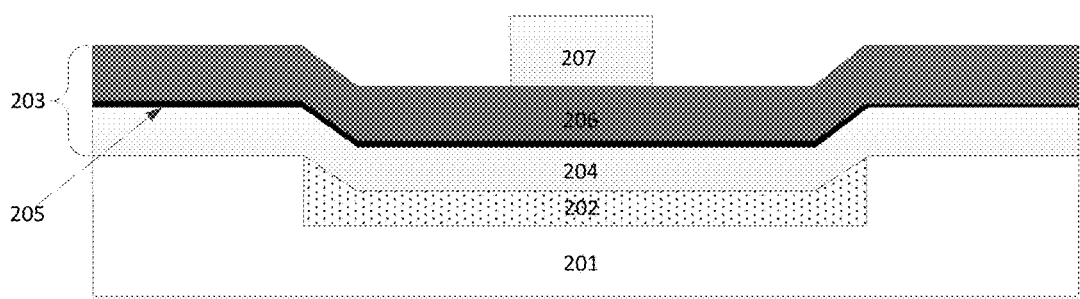
Figure 2G:
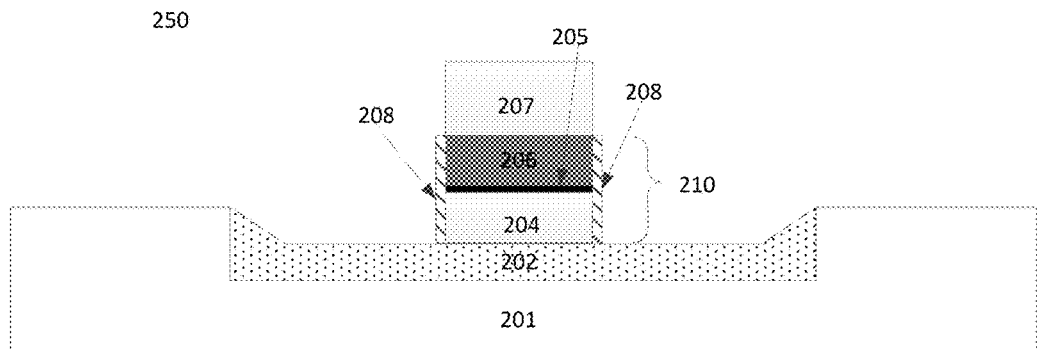
Figure 2H:
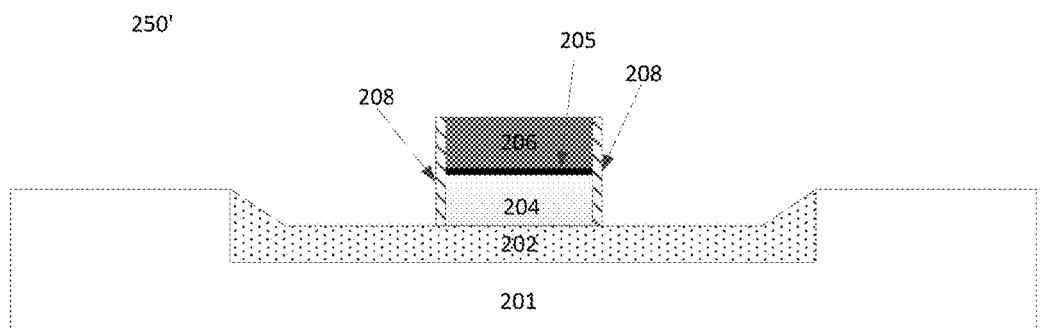

With the foregoing in mind attention is drawn to FIGS. 2E to 2G, which depict operations of a lithographic process for patterning a material stack, specifically material stack 203. As shown in FIG. 2E, patterning of material stack 203 may begin with the deposition of a mask 207 on the upper surface of material stack 203. In the illustrated embodiment, mask 207 is shown as being formed directly on the upper surface of free magnetic layer 206. However it should be understood that such a configuration is not required, and that one or more interlayers (e.g., electrical contacts, other layers, etc.) may be present between free magnetic layer 206 and mask 207.

Mask 207 may be formed from or include any suitable material which may serve to mask one or more regions of material stack 203, e.g., during a subsequent etching or other selective removal process. Without limitation, in some embodiments mask 207 is a hardmask that may be resistant to being removed during subsequent processes to selectively remove regions of layer stack 203. For example, in some embodiments mask 207 is a heavy metal hardmask, such as hardmask formed from or containing ruthenium, tantalum, tungsten, hafnium, molybdenum, combinations and/or alloys thereof, and the like. Without limitation, in some embodiments mask 207 is a tantalum hardmask.

After mask 207 is deposited, it may be patterned (e.g., via a lithographic or other process) to define a protected region (not labeled) of material stack 203. For example and as shown in FIG. 2F, regions of mask 207 may be removed, such that a portion of mask 207 remains to serve as a mask for the subsequent processing of material stack 203. It is noted that in the illustrated embodiment, mask 207 has been processed such that only a portion of it proximate a center of groove 220 remains. In this way, the remaining portion of mask 207 may protect underlying portions of material stack 203, e.g., during subsequent processing steps.

Once mask 207 has been patterned or is otherwise defined over one or more regions of material stack 203, patterning of material stack may proceed. For example, patterning of material stack 203 may proceed by selectively removing regions of material stack 203 that are not protected by mask 203. In this regard, selective removal of such regions may proceed in any suitable manner, such as by an etching or other suitable process. Without limitation, in some embodiments patterning of layer stack is performed subjecting the structure of FIG. 2F to plasma etching. During such etching, ions in a plasma may contact unprotected regions of layer stack 203, thereby removing portions of layer stack 203 (i.e., free magnetic layer 206, dielectric layer 205, and fixed magnetic layer 204) that are not protected by mask 207. Plasma etching may proceed until the regions of layer stack that are not protected by mask 207 are completely removed from the surface of conductive layer 202, resulting in the production of an STTM precursor 250 including a magnetic tunnel junction 210 having structure shown in FIG. 2G.

Returning to FIG. 1, at this point the operations of block 108 may be considered complete. The method may then proceed to optional block 110, pursuant to which mask 207 may optionally be removed from the upper surface of free magnetic layer 206, resulting in an STTM precursor 250' including a magnetic tunnel junction having the structure shown in FIG. 2H. Such removal may be performed using lithography, a milling process (e.g., ion beam milling), or some other suitable method, as desired.

As shown in the embodiments of FIGS. 2G and 2H, magnetic tunnel junction 210 may have a pillar, or "dot-like" geometry that which extends from a surface of conductive layer 202. As further shown however, during the selective removal process components of free magnetic layer 206, fixed magnetic layer 204, and/or dielectric layer 205 that are removed from the upper surface of conductive layer 202 may redeposit on one or more of the sidewalls of magnetic tunnel junction 210, resulting in the formation of a re-deposited layer 208. As further shown, in some instances re-deposited layer 208 may extend from fixed magnetic layer 204 to free magnetic layer 206. In instances where re-deposited layer 208 includes conductive material (e.g., iron, cobalt, etc. from the free and/or fixed magnetic layers), this may create an electrical pathway between the free magnetic layer 206 and fixed magnetic layer 204, potentially leading to a short.

It may therefore be desirable to disrupt the continuity of re-deposited layer 208, e.g., in a region proximate dielectric layer 205, so as to address this issue. As may be appreciated, this could be accomplished by removing re-deposited layer 208, e.g., via an ion beam milling process by which ions may be introduced at an angle relative to substrate 201, and may sputter off or otherwise remove the material of re-deposited layer from the sidewalls of MTJ 210. During such a process however ions may also contact the surface of conductive layer 202, potentially causing the conductive material of conductive layer 202 to be ejected from the surface thereof. In some instances, at least a portion of the conductive material of conductive layer 202 may re-deposit on the sidewalls of MTJ 210, leading to the same or similar electric issues as the re-deposited layer 208.

With the foregoing in mind, the present disclosure envisions a wide variety of alternative methods for interrupting the continuity of re-deposited layer 208. However for the sake of clarity and ease of understanding, the present disclosure will proceed to describe a process by which the continuity of re-deposited layer 208 is disrupted by selectively removing portions of re-deposited layer, e.g., to introduce a break therein at a region proximate dielectric layer 205. It should therefore be understood that the following discussion is for the sake of example only, and that the continuity of re-deposited layer may be disrupted by introducing a break at any suitable location, or through some other suitable means. Moreover as will become apparent from the following discussion, the methods herein may limit or prevent the re-deposition of conductive material from conductive layer 202 on the sidewalls of MTJ 210.

Again returning to FIG. 1, following the operations of block 108 and/or the operations of optional block 110, the method may proceed to block 112, pursuant to which a dielectric material may be deposited on STTM precursor 250 or 250'. For the sake of simplicity, the following discussion focuses on an embodiment in which a dielectric material is deposited on STTM precursor 250', i.e., an embodiment in which mask 207 has been removed from the surface of free magnetic layer 206. It should be understood however that the following description would equally apply in other embodiments, e.g., in which mask 207 remains on the surface of free magnetic layer 206, as generally shown in STTM precursor 250 in FIG. 2G.

In any case, deposition of the dielectric material may be performed in any suitable manner. Without limitation, in some embodiments the dielectric material is performed in such a manner as to result in the non-conformal deposition of dielectric material on the exposed surfaces of STTM precursor 250'. As used herein, the term "non-conformal deposition" is used to refer to a situation in which the deposition rate of the material being deposited depends on the angle of the reactants that are being deposited relative to the surface upon which they are deposited. Thus for example, in some non-conformal deposition process the deposition rate of reactants is larger on surfaces that are substantially normal (perpendicular) to the flow of incoming reactants than it is on surfaces that are substantially parallel to flow of incoming reactants. Put in more general terms, in some instances a non-conformal deposition process may result in higher deposition rates on substantially horizontal substrate surfaces, and lower deposition rates on substantially vertical surfaces. Alternatively, non-conformal deposition processes can be configured to deposit reactants on vertical substrate surfaces at a higher rate than horizontal substrate surfaces. Without limitation, in some embodiments deposition of the dielectric material on STTM precursor 250' is performed such that the deposition rate of dielectric material on horizontal surfaces thereof is greater than the deposition rate of dielectric material on the vertical surfaces thereof.

Figure 2I:
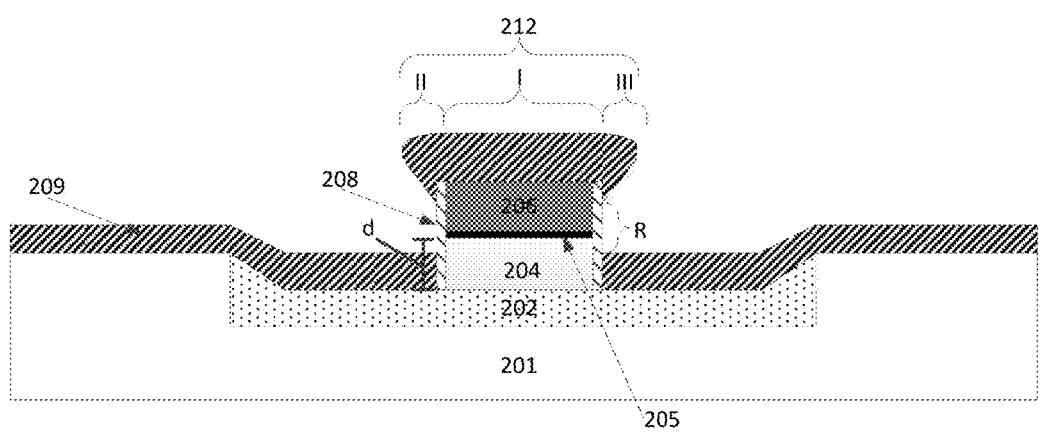
Figure 2J:
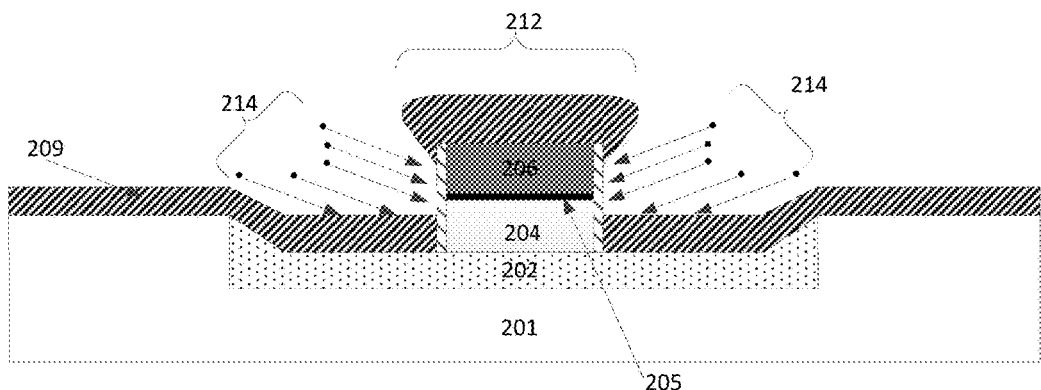
Figure 2K:
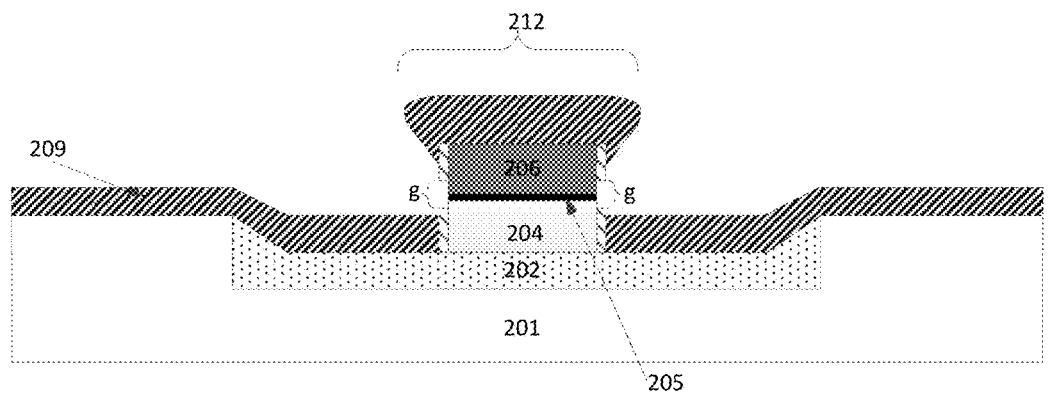

To illustrate this concept reference is made to FIG. 2I, which depicts one example of the outcome of a non-conformal deposition operation consistent with the present disclosure. In the illustrated embodiment, non-conformal deposition was performed via physical vapor deposition to deposit dielectric material 209 (also referred to herein as a second dielectric layer) on substantially horizontal surfaces at a first deposition rate and to deposit dielectric material 209 on substantially vertical surfaces at a second deposition rate, wherein the first deposition rate is greater than the second deposition rate. As shown in FIG. 2I, the outcome of such a process may be the deposition of a relatively thick layer of dielectric layer 209 on horizontal surfaces of the structure of FIG. 2H ((e.g., the surface of substrate 201, conductive layer 202, the upper surface of free magnetic layer 206, etc.), without or without substantially depositing dielectric material 209 on substantially vertical surfaces (e.g., the sidewalls of MTJ 210 and/or at least a portion of the exposed surface of re-deposited layer 208.

In some embodiments, the non-conformal deposition of dielectric material 209 may be controlled such that the thickness of dielectric material 209 on conductive layer 202 is less than the distance (height) between the upper surface of conductive layer 202 and the lower surface of dielectric layer 206, i.e., such that is less than the total thickness of fixed magnetic layer 204. In this regard, in some embodiments dielectric layer 209 may be deposited on the surface of conductive layer 202 to a thickness, t, wherein t ranges from about 20 to about 80% of d, such as from about 30 to about 70% of d. In such instances, d may correspond to the total thickness of fixed magnetic layer 204, which as noted above may range from about 50 to about 300 angstroms, such as about 50 to about 200 angstroms. As such in these example embodiments, t may range from about 15 angstroms to about 210 angstroms.

In this manner and as can be seen in FIG. 2I, dielectric material 209 may cover the upper surfaces of conductive layer 202 and free magnetic layer 206, but may leave a region, R, of sidewalls 208 exposed. Likewise, the non-conformal deposition of dielectric material 209 may result in the formation of a "crown" of dielectric material on the upper region of MTJ 210. For example and as illustrated in FIG. 2I, non-conformal deposition of dielectric material 209 may result in the formation of crown 212 on the upper surface of free magnetic layer 206. In this illustrated embodiment, crown 212 may have a non-linear surface that is relatively flat in a first region, I, above the upper surface of free magnetic layer 206, but which curves towards MTJ 210 in second and third regions, II and III, which may be located to the left and right of region I as shown in FIG. 2I.

Any suitable dielectric material may be used to form dielectric material 209. Non-limiting examples of such materials include dielectric oxides, nitrides, carbides, combinations thereof, and the like. Without limitation, in some embodiments dielectric material 209 is formed from or includes dielectric oxide, such as but not limited to silicon oxide, silicon dioxide, aluminum oxide, or a combination thereof. Moreover, in some embodiments dielectric material 209 may be compositionally the same or different from the dielectric material used to form substrate 201. In some embodiments, dielectric material 209 and the dielectric material of substrate 201 are compositionally the same and may be, for example, silicon oxide or silicon dioxide.

Returning to FIG. 1, following the deposition of the dielectric material the method may proceed from block 112 to block 114, pursuant to which at least a portion of the re-deposited layer on the sidewalls of the MTJ may be removed. For example, in some embodiments at least a portion of the re-deposited layer that is exposed (i.e., which is not covered by dielectric material 209) may be removed, e.g., via ion milling or another suitable process.

To illustrate this concept reference is made to FIG. 2J, which illustrates one example of a process for selectively removing at least a portion of re-deposited layer 208 from the sidewalls of MTJ 210. As shown, the structure of FIG. 2I may be exposed to energetic ions 214 (e.g., from an ion milling machine). Any suitable ions may be used for this purpose, including but not limited to ions of inert gases such as argon, helium, xenon, and the like. In any case, ions 214 may be introduced at an incident angle ranging from about 30 to 80 degrees, with 0 degrees being normal to the surface being milled. Moreover, the energy and or density of ions 214 may be set to achieve a desired rate of material removal. In some embodiments for example, the ions 214 may have an energy ranging from about 20 to about 1500 electron volts.

As shown in FIGS. 2J and 2K, ions 214 may contact an exposed portion of re-deposited layer 208. As a result, at least a portion of the re-deposited layer may be sputtered off (or otherwise removed) from the sidewalls of MTJ 210, resulting in the formation of a gap or break, g, in the re-deposited layer as shown in FIG. 2K. The break, g, may be have any suitable width, so long as it is sufficient to break the electrical continuity of re-deposited layer 208. In some embodiments, gap g is located and has a width such that it spans the entire thickness of dielectric layer 205 of MTJ 210.

In any case, it may be appreciated that gap g may disrupt the electrical continuity of re-deposited layer 208, thereby preventing that layer from causing an electrical short. Moreover while the ion milling process may result in the re-deposition of dielectric material 209 on the sidewalls of MTJ 210 and/or on re-deposited layer 208 (e.g., within gap g), such re-deposition may not be electrically problematic as dielectric material 209 is non-conductive.

The foregoing discussion of FIGS. 1 and 2A-2k focuses on an embodiment in which a precursor having a fixed magnetic layer (and various components thereof) that is on or directly on the surface of conductive layer 202. As a result, in such embodiments it may be desirable to control the thickness of a non-conformal dielectric layer (e.g. dielectric 209 as noted above) relative to the total thickness of fixed magnetic layer 204, as explained previously. As a result, it may be challenging to non-conformally deposit dielectric material 209 such that its thickness is less than that of fixed magnetic layer 204, as fixed magnetic layer 204 may be quite thin. With that in mind, in some embodiments it may be desirable to modify the process such that the thickness of non-conformal layer of dielectric material 209 may be increased while still leaving a desired region of re-deposited layer 208 exposed, e.g., for ion milling or another selective removal process.

In that regard reference is made to FIGS. 6A-6E, which stepwise illustrate the formation of an alternative STTM element in accordance with another example process consistent with the present disclosure. It is noted that the operations illustrated by FIGS. 6A-6E largely parallel the operations of FIGS. 2G-2K. Therefore for the sake of brevity, such operations are not reiterated in detail herein.

Figure 6A:
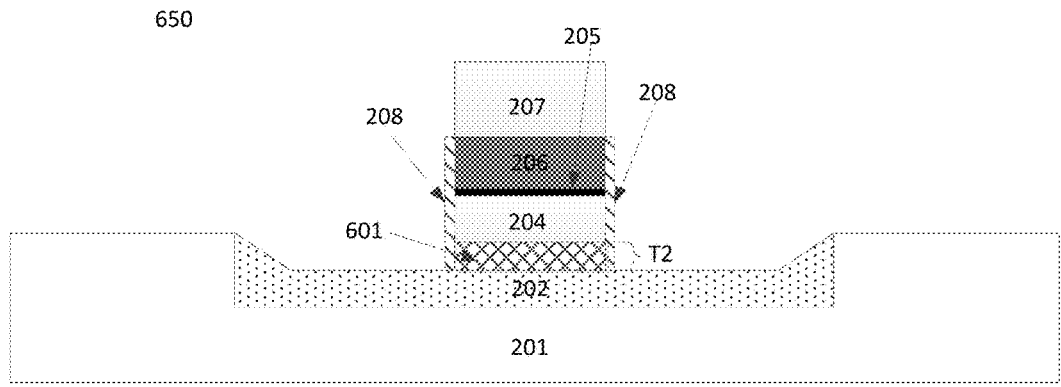
FIGS. 6A-6E stepwise illustrate cross sectional views of various operations in another method of forming a STTM element consistent with embodiments of the present disclosure.
Figure 6B:
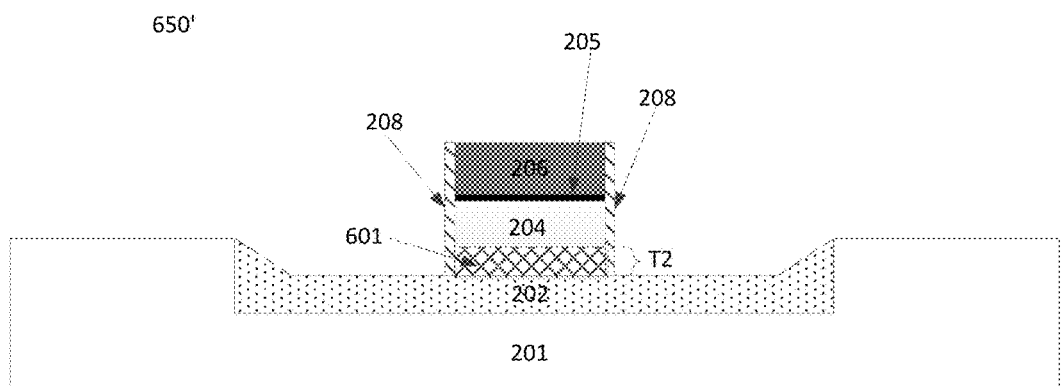
Figure 6C:
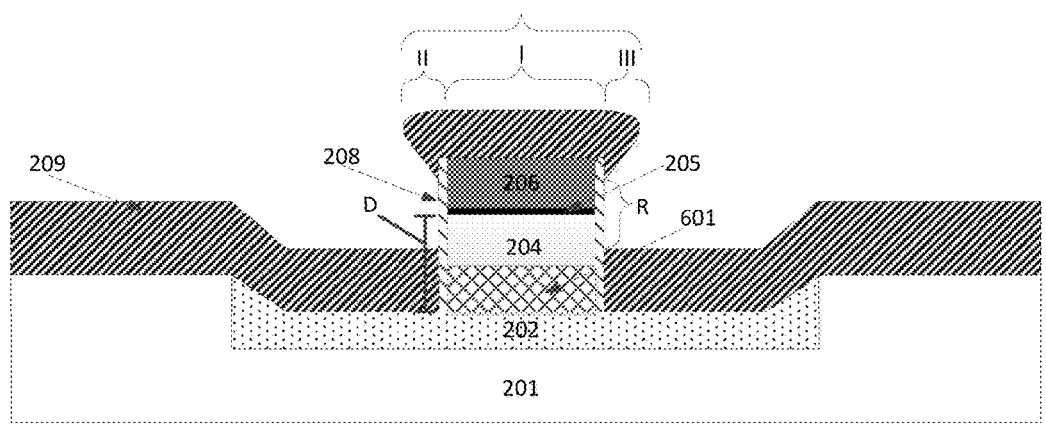
Figure 6D:
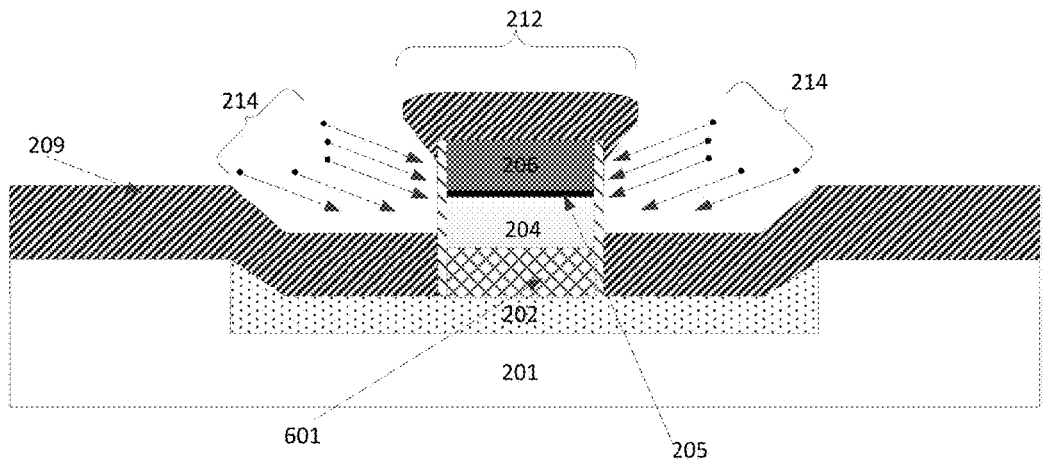
Figure 6E:
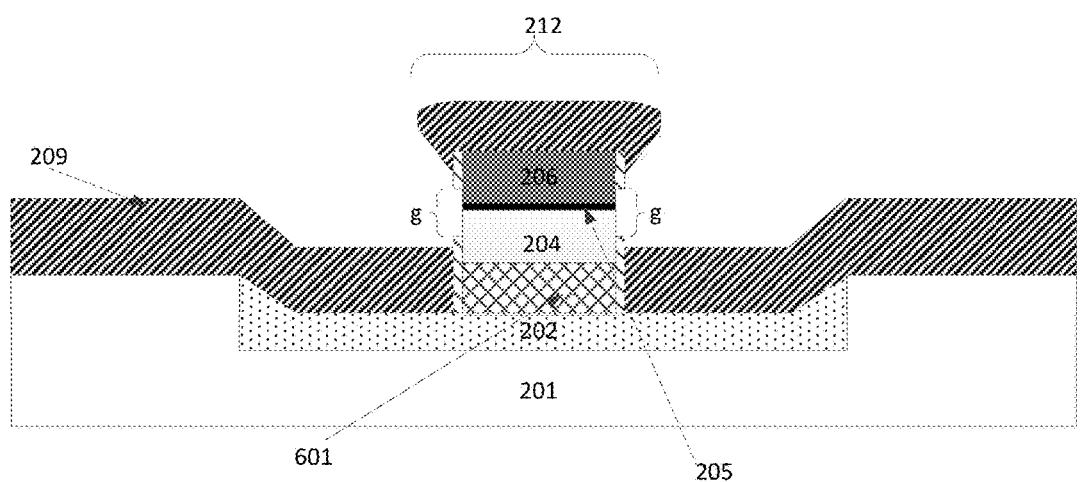

FIGS. 6A and 6B illustrate alternative device precursors 650, 650' which may be processed to form STTM elements consistent with the present disclosure. As an initial matter, many of the elements of FIGS. 6A and 6B are the same as described above in connection with device precursors 250, 250'. As such, the nature and function of those elements are not re-described here. With that in mind, it can be seen that device precursors 650, 650' differ from device precursors 250, 250' in that they include a shim layer 601 between fixed magnetic layer 204 and conductive layer 202.

Shim layer 601 generally functions to shim the MTJ structure of the STTM element defined by fixed magnetic layer 204, dielectric layer 205, and free magnetic layer 206 upwards by an amount corresponding to its thickness. In that way, shim layer 601 may allow for the deposition of a layer of non-conformal dielectric material 209 that is relatively thick, as compared to the thickness of the layer of non-conformal dielectric material 209 described above in connection with FIGS. 2I-2K.

Shim layer 601 may be formed from any suitable material. For example, in some embodiments shim lay may be formed from a material which may be patterned in the same or similar manner as fixed magnetic layer 204, but which may form one or more volatile compounds during the selective removal of regions of re-deposited layer 208. Non-limiting examples of such materials include volatile metals such as aluminum, titanium, tantalum, and ruthenium, combinations thereof, and the like, alone or in combination with volatile metal nitrides such as titanium nitride, tantalum nitride, combinations thereof, and the like.

The thickness of shim layer 204 may be any suitable thickness. In some embodiments and as shown in FIGS. 6A to 6B, shim layer 601 may have a thickness, T2, which ranges from greater than 0 to about 500 angstroms, such as from greater than 0 to about 300 angstroms. In such instances it may be understood that the shim layer 601 and fixed magnetic layer 204 may have a total thickness D, wherein D ranges from greater than 50 angstroms to about 800 angstroms, such as from greater than 50 angstroms to about 700 angstroms. In some instances T2 may be about 300 angstroms, in which can the total thickness D of the fixed magnetic layer 204 and shim layer 601 may be about 320 to about 350 angstroms. In such instances the thickness of dielectric material 209 may range from about 20 to about 80% of D, such as from about 30 to about 70% of D. Thus for example where the total thickness D is about 320 to about 350 angstroms, the thickness of dielectric material 209 may range from about 64 angstroms to about 280 angstroms, such as from about 96 angstroms to about 252 angstroms. Of course, other thickness ranges for dielectric material 209, shim layer 601, and fixed magnetic layer 204 are possible and are envisioned by the present disclosure.

Another aspect of the present disclosure relates to STTM devices including one or more STTM elements, such as those having the structure shown in FIG. 2K described above. It is noted that while the present disclosure focuses on perpendicular STTM devices and elements, horizontal or planar STTM elements/devices are also contemplated.

Figure 3:
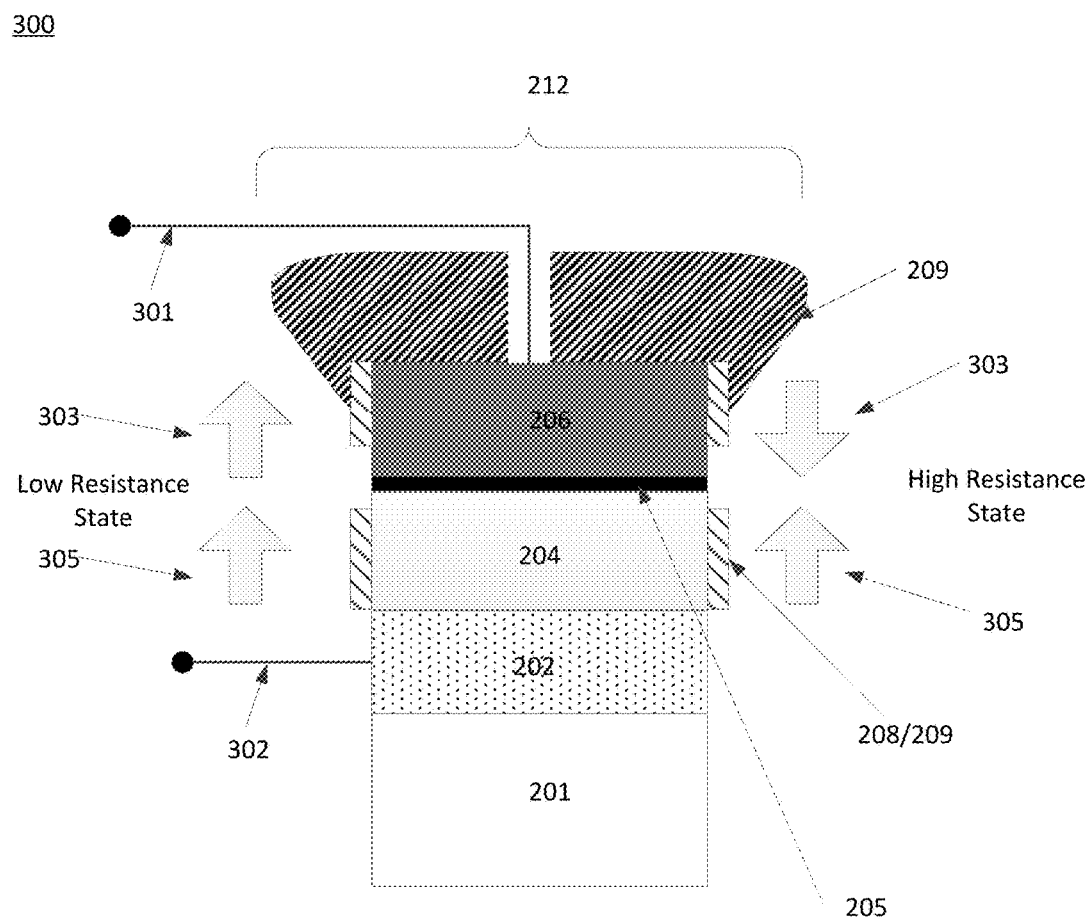
FIG. 3 illustrates a cross sectional view of one example of a perpendicular STTM device consistent with embodiments of the present disclosure

In this regard reference is made to FIG. 3, which illustrates one example of an STTM element/device consistent with the present disclosure. As shown, STTM element/device 300 may include a material stack (not labeled) on a conductive layer 202, such as an interconnect. Conductive layer 202 may be formed on a substrate 201, as previous described. As shown, the material stack may include including a fixed magnetic layer 204 on conductive layer 202, a dielectric layer 205 on fixed magnetic layer 204, and a free magnetic layer 206 on dielectric layer 205. The nature and function of such layers has been previously described, and therefore is not reiterated for the sake of brevity.

As noted above, fixed magnetic layer 202 may have a magnetic orientation that is pinned in a direction that is perpendicular to the plane of substrate 201. This concept is shown in FIG. 3, wherein the orientation 305 of the magnetization of fixed magnetic layer is shown with an arrow directed perpendicular to the plane of substrate 201. As previously explained and as would be understood by those of skill in the art of STTM devices, free magnetic layer 206 may have an orientation 303 of magnetization that may be also be perpendicular to the plane of substrate 201, but which may be aligned parallel or antiparallel with the orientation of magnetization of fixed magnetic layer 303. As shown in FIG. 3, when the orientation 303 of magnetization of free magnetic layer 206 is aligned parallel with the orientation 305 of magnetization of fixed magnetic layer 206, element/device 300 may be in a low resistance state, i.e., a state in which electrons may tunnel relatively easily through dielectric layer 205. In instances where orientation 303 is aligned antiparallel to orientation 305, however, element 300 may be in a high resistance state, i.e., a state in which it is relatively more difficult for electrons to tunnel through dielectric layer 205.

Consistent with the previous description, although not shown in FIG. 3 the material stack may include additional layers above and/or below free magnetic layer 206, fixed magnetic layer 204, or both. For example, in some embodiments a first contact (electrode), e.g., of tantalum, is formed as a layer below fixed magnetic layer 204, and a second contact (electrode), e.g., of tantalum, is formed as a layer above free magnetic layer 206. Alternatively or additionally, in some embodiments a synthetic antiferromagnetic layer is formed below fixed magnetic layer 204.

Consistent with the foregoing description, the free magnetic layer, dielectric layer, and fixed magnetic layer may form a magnetic tunnel junction having one or more sidewalls. As further shown in FIG. 3, a re-deposited layer 208 may be present on such sidewalls. In some embodiments, re-deposited layer 208 may include components of one or more of free magnetic layer 206, dielectric layer 205, and/or fixed magnetic layer 204, such as one or more metals. Alternatively or additionally, all or a portion of the re-deposited layer may include and/or be formed from a dielectric material, such as dielectric material 209 described previously.

As further shown in FIG. 3, device/element 300 may include a crown 212 of dielectric material 209 on an upper surface thereof, e.g., on an upper surface of free magnetic layer 206. The nature and configuration of crown 212 has been previously described, and so is not reiterated in detail herein. As shown in FIG. 3 however, in some embodiments a first electrode 301 (e.g. a first trace) may pass through crown 212 (e.g., in a region I thereof), and may function to couple free magnetic layer 206, e.g., to another component such as a voltage source. Similarly, a second electrode 302 (e.g., a second trace) may be coupled to conductive material 202, e.g., so as to electrically couple fixed magnetic layer to another component. Via first and second electrodes 301, 302, voltage may be applied to device/element 300, causing orientation 303 to switch from a direction that is parallel with orientation 305 to a direction that is anti-parallel with orientation 305, and vice versa.

Figure 4:
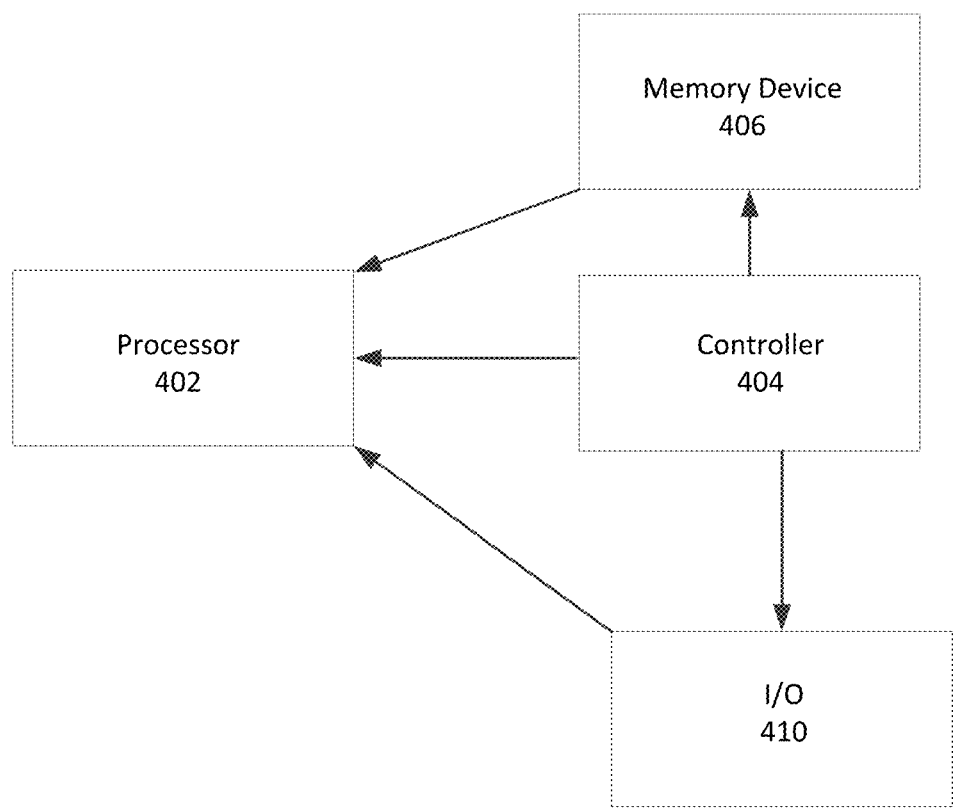
FIG. 4 is a block diagram of an electronic system consistent with embodiments of the present disclosure.

FIG. 4 illustrates a block diagram of an electronic system 400 in accordance with embodiments of the present disclosure. Electronic system 400 may correspond to, for example, a portable system, a computer system, a process control system, or any other system that uses a processor and associated memory. Electronic system 400 may include, for example, a processor 402, a controller 404, a memory device 406, and an input/output device (I/O) 410. While system 400 is depicted in FIG. 4 with limited components, it should be understood that it may include a plurality of processors, memory devices, controllers, I/O's and other elements that may be found in integrated circuits. In some embodiments, system 400 may be configured to execute instructions which define operations which are to be performed on data by processor 402, as well as other transactions between processor 402, memory device 406, controller 404, and/or I/O 410.

In general, controller 404 may function to coordinate the operations of processor 404, memory device 406, and I/O 410 by cycling through a set of operations that cause instructions to be retrieved from memory device 708 and executed. In this regard, memory device 406 may include a STTM element and/or device, such as those described above. In some embodiments, memory device 406 includes a plurality of in-plane or perpendicular STTM elements. Alternatively or additionally, one or more STTM elements/devices consistent with the present disclosure may be embedded in processor 402, controller 404, and/or I/O 410, e.g., a local memory.

Figure 5:
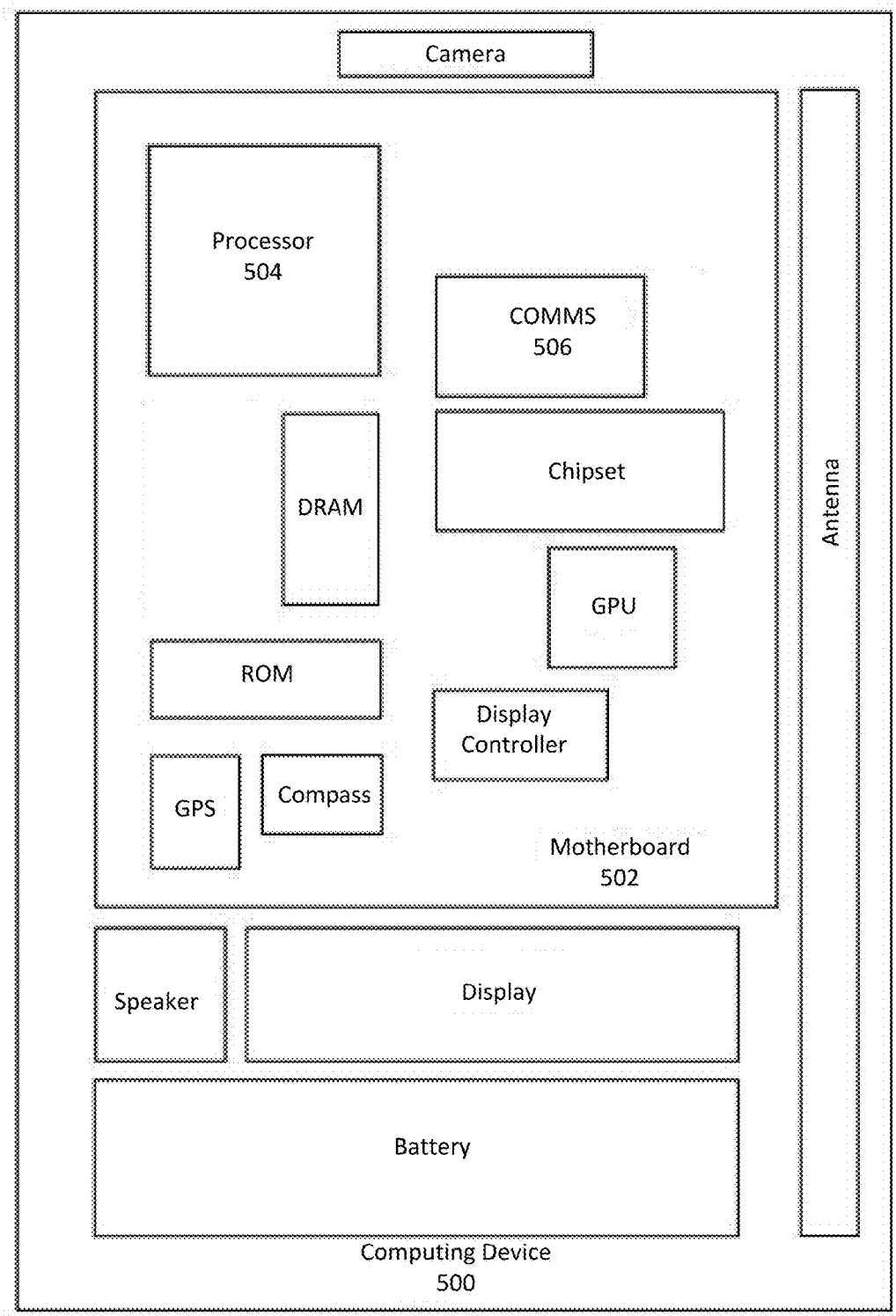
FIG. 5 is a block diagram of a computing device consistent with embodiments of the present disclosure.

Another aspect of the present disclosure relates to a computing device: including STTM elements/devices consistent with the present disclosure. In this regard reference is made to FIG. 5, which illustrates a computing device 500 in accordance with various embodiments of the present disclosure. As shown, computing device 500 includes motherboard 802, which may include various components such as but not limited a processor 404, communications circuitry (COMMS) 506, any or all of which may be physically and electronically coupled with motherboard 502.

Depending on its application, computing device 500 may also include other components, such as but not limited to volatile memory (e.g., DRAM), non-volatile memory (e.g., ROM), flash memory, a graphics processor, a digital signal processor, a crypto processor, a chipset, an antenna, a display, a touchscreen controller, a battery, various codecs, various sensors (e.g., a global positioning system (GPS), accelerometer, gyroscope, etc.), one or more speakers, a camera, and/or a mass storage device.

COMMS 406 may be configured to enable wired or wireless communication for the transfer of data to and from the computing device 400. In some embodiments, COMMS 406 may be configured to enable wireless communications via any of a number of wireless standards or protocols, including but not limited to Wi-Fi (IEEE 802.11 family), WiMAX (IEEE 802.16 family), IEEE 802.20, long term evolution (LTE), EV-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G and beyond.

STTM elements/devices may be included in integrated circuit dies that may be present in various components of computing device 500. For example, in some embodiments processor 504 may include an integrated circuit die that includes one or more memory devices, such as one or more STTM elements/devices described herein. Likewise, COMMS 406 may include an integrated circuit die that may include one or more STTM elements/devices consistent with the present disclosure. Moreover, various other memories of computing device 500 (e.g., DRAM, RON, mass storage, etc.) may be made up of or include STTM elements/devices consistent with the present disclosure.

Computing device 500 may any or a wide variety of computing devices, including but not limited to a laptop computer, a netbook computer, a notebook computer, an Ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder, combinations thereof, and the like. Of course such devices are enumerated for the sake of example only, and computing device 500 may be any suitable type of mobile or stationary electronic device.

As may be appreciated from the foregoing, the technologies described herein may enable the production STTM elements/devices, and integrated circuits including such components, wherein the electrical continuity of a re-deposited layer on the sidewalls of the STTM element/device is interrupted. In this way, the technologies described herein may enable and/or facilitate mass production of STTM elements/devices while reducing or even eliminating electrical shorts that may result from the presence of the re-deposited layer.

ADDITIONAL EMBODIMENTS

The following examples represent additional non-limiting embodiments of the present disclosure.

Example 1

According to this example there is provided a method of forming a spin transfer torque memory (STTM) element, including: providing an STTM precursor including a substrate, a conductive layer on the substrate, and a material stack on the conductive layer, at least a portion of the material stack defining a magnetic tunnel junction (MTJ) including a fixed magnetic layer, a first dielectric layer including a first dielectric material, and a free magnetic layer, the magnetic tunnel junction including at least one sidewall, wherein a re-deposited layer is present on at least one of the sidewalls, the re-deposited layer including components of at least one of the fixed magnetic layer, dielectric layer, and free magnetic layer; depositing a non-conformal second dielectric layer including a second dielectric material on an upper surface of the substrate, the conductive layer, and the MTJ, such that at least a portion of the re-deposited layer is exposed; and selectively removing at least some of the exposed portion of the re-deposited layer, so as to form a gap in the re-deposited layer.

Example 2

This example includes any or all of the elements of example 1, wherein selectively removing at least some of the exposed portion of the re-deposited layer is performed via ion milling.

Example 3

This example includes any or all of the elements of example 2, wherein the ion milling results in the re-deposition of the second dielectric material within the gap.

Example 4

This example includes any or all of the elements of example 1, wherein depositing the non-conformal second dielectric layer is performed via physical vapor deposition.

Example 5

This example includes any or all of the elements of example 1, wherein providing the STTM precursor includes: providing the substrate; forming at least one groove in the substrate; and forming the conductive layer in the at least one groove.

Example 6

This example includes any or all of the elements of example 5, wherein the width of the conductive layer is greater than the width of the MTJ in at least one dimension.

Example 7

This example includes any or all of the elements of any one of examples 1 to 6, wherein the fixed magnetic layer includes one or more layers of a cobalt, iron, boron alloy.

Example 8

This example includes any or all of the elements of any one of examples 1 to 7, wherein the free magnetic layer comprise one or more layers of a cobalt, iron, boron alloy.

Example 9

This example includes any or all of the elements of any one of examples 1 to 8, wherein the first dielectric material includes a dielectric oxide.

Example 10

This example includes any or all of the elements of example 9, wherein the first dielectric material includes magnesium oxide or aluminum oxide.

Example 11

This example includes any or all of the elements of any one of examples 1 to 10, wherein the STTM element is a planar STTM element or a perpendicular STTM element.

Example 12

This example includes any or all of the elements of any one of examples 1 to 11, wherein: a lower surface of the first dielectric layer of the MTJ is spaced from an upper surface of the conductive layer by a distance, d; the non-conformal second dielectric layer has a thickness t in a region above the conductive layer; and t is less than d.

Example 13

This example includes any or all of the elements of any one of examples 1 to 12, wherein the gap is formed in a region of the re-deposited layer proximate the first dielectric layer.

Example 14

This example includes any or all of the elements of example 13, wherein the first dielectric layer has a thickness and the gap spans an entirety of the thickness of the first dielectric layer.

Example 15

This example includes any or all of the elements of any one of examples 1 to 14, wherein depositing the non-conformal second layer results in the deposition of a crown of dielectric material on the magnetic tunnel junction.

Example 16

This example includes any or all of the elements of any one of examples 1 to 15, wherein the device precursor further includes a shim layer between the conductive layer and the fixed magnetic layer.

Example 17

This example includes any or all of the elements of any one of examples 1 to 16, wherein a thickness of the second dielectric layer is 20 to 80% of a total thickness of the fixed magnetic layer.

Example 18

This example includes any or all of the elements of example 16, wherein a thickness of the second dielectric layer is 20 to 80% of a total thickness of the shim layer and the fixed magnetic layer.

Example 19

According to this example there is provided an integrated circuit device, including at least one spin transfer torque memory (STTM) element, wherein:

the STTM element includes a substrate, a conductive layer on the substrate, and a material stack on the conductive layer, at least a portion of the material stack defining a magnetic tunnel junction (MTJ) including a fixed magnetic layer, a first dielectric layer including a first dielectric material, and a free magnetic layer, the magnetic tunnel junction including at least one sidewall, wherein a re-deposited layer is present on at least one of the sidewalls, the re-deposited layer including components of at least one of the fixed magnetic layer, dielectric layer, and free magnetic layer; and a gap is present in the re-deposited layer, the gap interrupting the electrical continuity of the re-deposited layer.

Example 20

This example includes any or all of the elements of example 19, further including a second dielectric material within the gap.

Example 21

This example includes any or all of the elements of example 19, wherein: the substrate includes at least one groove; and the conductive layer is present within the at least one groove.

Example 22

This example includes any or all of the elements of any one of examples 19 to 21, wherein the width of the conductive layer is greater than the width of the MTJ in at least one dimension.

Example 23

This example includes any or all of the elements of any one of examples 19 to22, wherein the fixed magnetic layer includes one or more layers of a cobalt, iron, boron alloy.

Example 24

This example includes any or all of the elements of any one of examples 19 to 23, wherein the free magnetic layer comprise one or more layers of a cobalt, iron, boron alloy.

Example 25

This example includes any or all of the elements of any one of examples 19 to 24, wherein the first dielectric material includes a dielectric oxide.

Example 26

This example includes any or all of the elements of example 25, wherein the first dielectric material includes magnesium oxide or aluminum oxide.

Example 27

This example includes any or all of the elements of any one of examples 19 to 26, wherein the STTM element is a planar STTM element or a perpendicular STTM element.

Example 28

This example includes any or all of the elements of any one of examples 19 to 27, wherein: a lower surface of the first dielectric layer of the MTJ is spaced from an upper surface of the conductive layer by a distance, d; the non-conformal second dielectric layer has a thickness t in a region above the conductive layer; and is less than d.

Example 29

This example includes any or all of the elements of any one of examples 19 to 28, wherein the gap is formed in a region of the re-deposited layer proximate the first dielectric layer.

Example 30

This example includes any or all of the elements of example 29, wherein the first dielectric layer has a thickness and the gap spans an entirety of the thickness of the first dielectric layer.

Example 31

This example includes any or all of the elements of example 20, further including a crown of the second dielectric material on the magnetic tunnel junction.

Example 32

This example includes any or all of the elements of any one of examples 19 to 31, further including a shim layer between the conductive layer and the fixed magnetic layer.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An integrated circuit device comprising at least one spin transfer torque memory (STTM) element, wherein:
   the STTM element comprises a substrate, a conductive layer on the substrate, and a material stack on the conductive layer, at least a portion of the material stack defining a magnetic tunnel junction (MTJ) including a fixed magnetic layer, a first dielectric layer comprising a first dielectric material, and a free magnetic layer, the magnetic tunnel junction comprising at least one sidewall, wherein a re-deposited layer is present on at least one of said sidewalls, the re-deposited layer comprising components of at least one of said fixed magnetic layer, dielectric layer, and free magnetic layer; and a gap is present in the re-deposited layer, the gap interrupting the electrical continuity of the re-deposited layer and comprising a second dielectric material.

2. The integrated circuit of claim 1, wherein said first dielectric material comprises a dielectric oxide.

3. The integrated circuit of claim 2, wherein said first dielectric material comprises magnesium oxide or aluminum oxide.

4. The integrated circuit of claim 1, wherein said STTM element is a planar STTM element or a perpendicular STTM element.

5. The integrated circuit of claim 1, wherein:
a lower surface of said first dielectric layer of said MTJ is spaced from an upper surface of said conductive layer by a distance, d;
said non-conformal second dielectric layer has a thickness tin a region above said conductive layer; and
t is less than d.

6. The integrated circuit of claim 1, further comprising a crown of said second dielectric material on said magnetic tunnel junction.

7. The integrated circuit of claim 1, further comprising a shim layer between said conductive layer and said fixed magnetic layer.

8. An integrated circuit device comprising at least one spin transfer torque memory (STTM) element, wherein:
the STTM element comprises a substrate that includes at least one groove, a conductive layer that is disposed on the substrate and present within said at least one groove, and a material stack on the conductive layer, at least a portion of the material stack defining a magnetic tunnel junction (MTJ) that includes a fixed magnetic layer, a first dielectric layer comprising a first dielectric material, and a free magnetic layer, the magnetic tunnel junction comprising at least one sidewall, wherein a re-deposited layer is present on at least one of said sidewalls, the re-deposited layer comprising components of at least one of said fixed magnetic layer, dielectric layer, and free magnetic layer;
a gap is present in the re-deposited layer, the gap interrupting the electrical continuity of the re-deposited layer; and
the width of the conductive layer is greater than the width of said MTJ in at least one dimension.

9. An integrated circuit device comprising at least one spin transfer torque memory (STTM) element, wherein:
the STTM element comprises a substrate, a conductive layer on the substrate, and a material stack on the conductive layer, at least a portion of the material stack defining a magnetic tunnel junction (MTJ) including a fixed magnetic layer, a first dielectric layer having a thickness and comprising a first dielectric material, and a free magnetic layer, the magnetic tunnel junction comprising at least one sidewall, wherein a re-deposited layer is present on at least one of said sidewalls, the re-deposited layer comprising components of at least one of said fixed magnetic layer, dielectric layer, and free magnetic layer; and
a gap is present in the re-deposited layer, wherein said gap is formed in a region of the re-deposited layer proximate said first dielectric layer, interrupts the electrical continuity of the re-deposited layer, and spans an entirety of the thickness of the first dielectric layer.

* * * * *